(12) United States Patent
Hsu

(10) Patent No.: US 10,797,064 B2
(45) Date of Patent: Oct. 6, 2020

(54) SINGLE-POLY NON-VOLATILE MEMORY CELL AND OPERATING METHOD THEREOF

(71) Applicant: eMemory Technology Inc., Hsinchu (TW)

(72) Inventor: Chia-Jung Hsu, Taoyuan (TW)

(73) Assignee: EMEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 16/508,993

(22) Filed: Jul. 11, 2019

(65) Prior Publication Data
US 2020/0091168 A1   Mar. 19, 2020

Related U.S. Application Data

(60) Provisional application No. 62/733,089, filed on Sep. 19, 2018.

(51) Int. Cl.
*G11C 11/34* (2006.01)
*G11C 16/04* (2006.01)
(Continued)

(52) U.S. Cl.
CPC ......... *H01L 27/11558* (2013.01); *G11C 7/24* (2013.01); *G11C 11/165* (2013.01); *G11C 11/419* (2013.01); *G11C 13/0021* (2013.01); *G11C 14/0054* (2013.01); *G11C 16/0433* (2013.01); *G11C 16/10* (2013.01); *G11C 16/14* (2013.01); *G11C 16/26* (2013.01); *G11C 17/16* (2013.01); *H01L 27/11524* (2013.01); *H01L 29/1095* (2013.01); *H01L 29/4916* (2013.01); *H03K 3/012* (2013.01); *H03K 3/037* (2013.01); *H03K 19/018521* (2013.01); *H03K 19/20* (2013.01)

(58) Field of Classification Search
CPC ............ G11C 16/0425; G11C 16/0433; G11C 16/0458; G11C 11/5628; H01L 27/11558; H01L 27/11524; H01L 29/4916
See application file for complete search history.

(56) References Cited

U.S. PATENT DOCUMENTS 5,394,002 A * 2/1995 Peterson ............ G11C 16/0416
257/315
5,940,324 A 8/1999 Chi et al.
(Continued)

*Primary Examiner* — Toan K Le
(74) *Attorney, Agent, or Firm* — Birch, Stewart, Kolasch & Birch, LLP

(57) ABSTRACT

A non-volatile memory cell includes a floating-gate transistor, a select transistor, and a coupling structure. The floating-gate transistor is deposited in a P-well and includes a gate terminal coupled to a floating gate which is a first polysilicon layer, a drain terminal coupled to a bit line, and a source terminal coupled to a first node. The select transistor is deposited in the P-well and includes a gate terminal coupled to a select gate which is coupled to a word line, a drain terminal coupled to the first node, and a source terminal coupled to the source line. The floating-gate transistor and the select transistor are N-type transistors. The coupling structure is formed by extending the first polysilicon layer to overlap a control gate, in which the control gate is a P-type doped region in an N-well and the control gate is coupled to a control line.

36 Claims, 9 Drawing Sheets

(51) Int. Cl.
*H01L 27/11558* (2017.01)
*H01L 29/10* (2006.01)
*H01L 27/11524* (2017.01)
*G11C 16/14* (2006.01)
*G11C 16/26* (2006.01)
*G11C 16/10* (2006.01)
*H01L 29/49* (2006.01)
*H03K 3/012* (2006.01)
*H03K 19/0185* (2006.01)
*H03K 19/20* (2006.01)
*H03K 3/037* (2006.01)
*G11C 14/00* (2006.01)
*G11C 11/419* (2006.01)
*G11C 13/00* (2006.01)
*G11C 7/24* (2006.01)
*G11C 11/16* (2006.01)
*G11C 17/16* (2006.01)

(56) References Cited

U.S. PATENT DOCUMENTS

| | | | |
|---|---|---|---|
| 6,103,573 A * | 8/2000 | Harari | H01L 27/11521 257/202 |
| 8,344,443 B2 | 1/2013 | Chen et al. | |
| 8,625,350 B2 | 1/2014 | Ching et al. | |
| 8,634,254 B2 | 1/2014 | Hsu et al. | |
| 9,361,982 B2 | 6/2016 | Milani et al. | |
| 2007/0064494 A1 | 3/2007 | Morton et al. | |
| 2012/0069651 A1* | 3/2012 | Lee | G11C 16/0416 365/185.2 |
| 2015/0221371 A1* | 8/2015 | Milani | H01L 29/7881 365/185.28 |
| 2015/0221661 A1 | 8/2015 | Milani et al. | |

* cited by examiner

SINGLE-POLY NON-VOLATILE MEMORY CELL AND OPERATING METHOD THEREOF

CROSS REFERENCE TO RELATED APPLICATIONS

This application claims the benefit of U.S. Provisional Application No. 62/733,089, filed on Sep. 19, 2018, the entirety of which is incorporated by reference herein.

BACKGROUND OF THE INVENTION

Field of the Invention

The disclosure relates generally to a non-volatile memory cell and a non-volatile memory array, and more particularly it relates to an electrically erasable programmable (EEP) non-volatile memory cell and an EEP non-volatile memory array.

Description of the Related Art

Semiconductor memory devices have become popular for use in a variety of electronic devices. For example, non-volatile memory is widely used in cellular telephones, digital cameras, personal digital assistants, mobile computing devices, and other applications.

Generally, there are two types of non-volatile memory: multi-time programmable (MTP) memory and one-time programmable (OTP) memory. MTP memory is multi-readable and multi-writable. For example, electrically programmable and electrically erasable read-only memory (EE-PROM) and flash memory are designed to be equipped with some corresponding electric circuits to support different operations such as programming, erasing and reading. OTP functions perfectly with electric circuits with mere programming and reading functions. Electric circuits for erasing operations are not required in OTP.

Single-poly non-volatile memory designs have been proposed which reduce the additional processing cost. A single-poly non-volatile memory forms the charge-storage floating gate with a single layer of polysilicon. Because the single-poly non-volatile memory is compatible with regular CMOS process, it is applied in the field of embedded memory, embedded nonvolatile memory in the mixed-mode circuits and micro-controllers (such as System on Chip, SOC).

BRIEF SUMMARY OF THE INVENTION

Embodiments of the invention provide a non-volatile memory cell that has low power consumption, that can be programmed by page or byte, and that is suitable for any type of substrate. Embodiments of the invention further integrate the non-volatile memory cell into a non-volatile memory array. The corresponding operations of the non-volatile memory array in the read mode, the program mode, or the erase mode are fully described.

In an embodiment, a non-volatile memory cell comprises: a floating-gate transistor, a select transistor, and a coupling structure. The floating-gate transistor is deposited in a P-well and comprises a gate terminal, a drain terminal, and a source terminal, in which the gate terminal is coupled to a floating gate, the drain terminal is coupled to a bit line, and the source terminal is coupled to a first node. The floating gate is formed by a first polysilicon layer. The select transistor is deposited in the P-well and comprises a gate terminal, a drain terminal, and a source terminal, in which the gate terminal is coupled to a select gate, the drain terminal is coupled to the first node, and the source terminal is coupled to a source line. The select gate is coupled to a word line, and the floating-gate transistor and the select transistor are N-type transistors. The coupling structure is formed by extending the first polysilicon layer to overlap a control gate, in which the control gate is a P-type doped region in an N-well and the control gate is coupled to a control line.

A non-volatile memory array comprising a plurality of non-volatile memory cells, which comprise at least a first non-volatile memory cell, a second non-volatile memory cell, a third non-volatile memory cell, and a fourth non-volatile memory cell, is provided herein. Each of the non-volatile memory cells comprises: a floating-gate transistor, a select transistor, and a coupling structure. The floating-gate transistor is deposited in a P-well and comprises a gate terminal, a drain terminal, and a source terminal, in which the gate terminal is coupled to a floating gate, the drain terminal is coupled to a bit line, and the source terminal is coupled to a first node. The floating gate is a first polysilicon layer. The select transistor is deposited in the P-well and comprises a gate terminal, a drain terminal, and a source terminal, in which the gate terminal is coupled to a select gate, the drain terminal is coupled to the first node, and the source terminal is coupled to a source line. The select gate is coupled to a word line, and the floating-gate transistor and the select transistor are N-type transistors. The coupling structure is formed by stretching the first polysilicon layer to overlap a control gate, in which the control gate is a P-type doped region in an N-well and the control gate is coupled to a control line.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
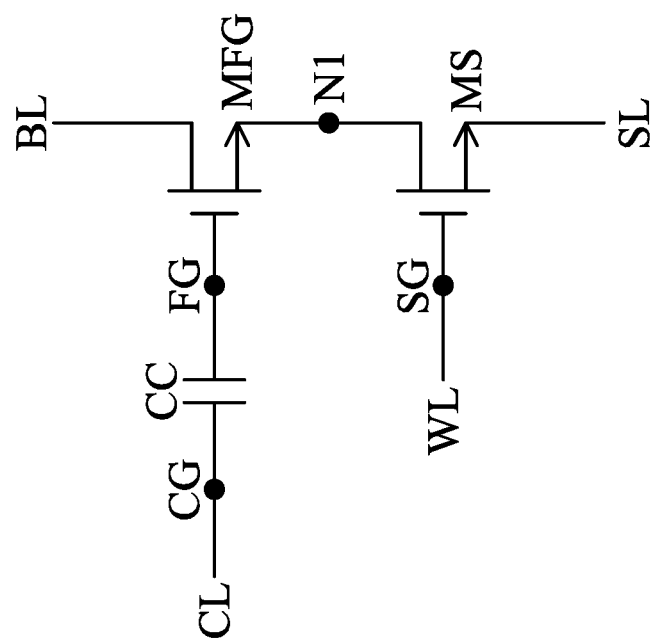
FIG. 1 is a schematic diagram of a non-volatile memory cell in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a schematic diagram of a non-volatile memory cell in accordance with an embodiment of the invention. As shown in FIG. 1, the non-volatile memory cell 100 includes a floating-gate transistor MFG, a select transistor MS, and a coupling capacitor CC. According to an embodiment of the invention, the floating-gate transistor MFG and the select transistor MS are N-type transistors.

The floating-gate transistor MFG includes a gate terminal, a drain terminal, and a source terminal, in which the gate terminal is coupled to a floating gate FG, the drain terminal is coupled to a bit line BL, and the source terminal is coupled to a first node N1. The select transistor MS includes a gate terminal, a drain terminal, and a source terminal, in which the gate terminal is coupled to a select gate SG, the drain terminal is coupled to the first node N1, and the source terminal is coupled to the source line SL. According to an embodiment of the invention, the select gate SG is coupled to the word line WL.

The coupling capacitor CC is coupled between the floating gate FG and a control gate CG. According to an embodiment of the invention, the control gate CG is coupled to the control line CL. According to an embodiment of the invention, the non-volatile memory cell 100 is programmed and erased by Fowler-Nordheim method such that the non-volatile memory cell 100 may achieve low power consumption.

Figure 2:
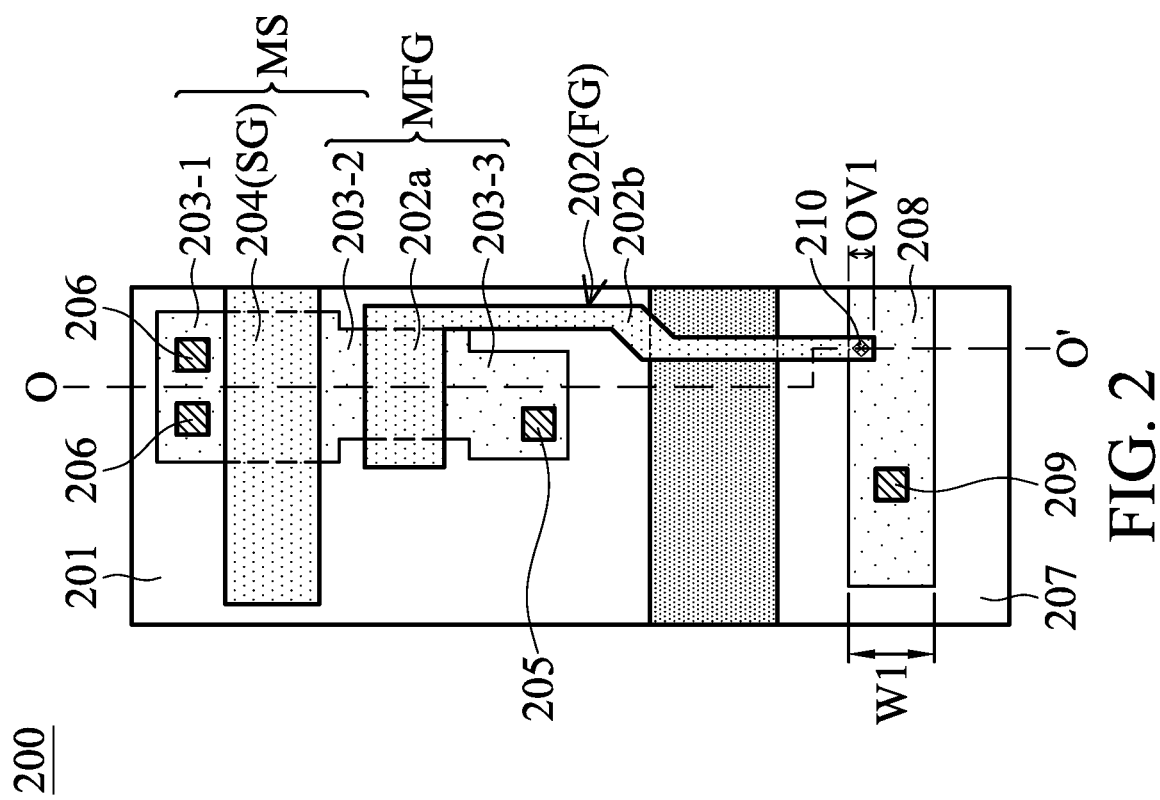
FIG. 2 illustrates a top view of a layout of the non-volatile memory cell in FIG. 1 in accordance with an embodiment of the invention.

FIG. 2 illustrates a top view of a layout of the non-volatile memory cell in FIG. 1 in accordance with an embodiment of the invention. As shown in FIG. 2, the floating-gate transistor MFG and the select transistor MS in FIG. 1 is deposited in the P-well 201. The floating gate FG is formed by the first polysilicon layer 202 of a polysilicon layer, in which the first polysilicon layer 202 includes a first part 202a and a second part 202b.

As shown in FIG. 2, the first part 202a is overlapped with the second N-type doped region 203-2 and the third N-type doped region 203-3. The second part 202b extends from the P-well 201 to the N-well 207.

The floating-gate transistor MFG in FIG. 1 is formed by the first part 202a, the second N-type doped region 203-2 and the third N-type doped region 203-3. In some embodiments, the floating gate FG is overlapped with the second N-type doped region 203-2 and the third N-type doped region 203-3.

The select gate SG is formed by the second polysilicon layer 204, in which the select transistor MS in FIG. 1 is formed by the second polysilicon layer 204, the first N-type doped region 203-1 and the second N-type doped region 203-2. In some embodiments, the second polysilicon layer 204 of the select gate SG is overlapped with the first N-type doped region 203-1 and the second N-type doped region 203-2.

According to an embodiment of the invention, the second polysilicon layer 204 (i.e., the select gate SG) is coupled to the word line WL. As shown in FIG. 2, at least one bit-line contact 205 electrically couples the third N-type doped region 203-3 to the bit line BL in FIG. 1, and one or more source-line contacts 206 electrically couple the first N-type doped region 203-1 to the source line SL in FIG. 1.

As shown in FIG. 2, the N-well 207 is deposited apart from the P-well 201. A P-type doped region 208 corresponding to the control gate CG in FIG. 1 is deposited in the N-well 207, and the control-line contact 209 electrically couples the P-type doped region 208 to the control line CL.

The second part 202b includes a first overlapped area 210 that is overlapped with the P-type doped region 208 which forms the coupling capacitor CC in FIG. 1. As shown in FIG. 2, the first overlapped area 210 has a first overlap width OV1 which is less than a first width W1 of the P-type doped region 208. According to another embodiment of the invention, the first overlap width OV1 may be equal to the width of the P-type doped region 208.

According to an embodiment of the invention, the non-volatile memory cell 200 in FIG. 2 is fabricated in a P-type substrate. According to another embodiment of the invention, the non-volatile memory cell 200 in FIG. 2 may be fabricated in an N-type substrate. According to yet another embodiment of the invention, the non-volatile memory cell 200 in FIG. 2 may be fabricated in a deep N-well.

Figure 3:
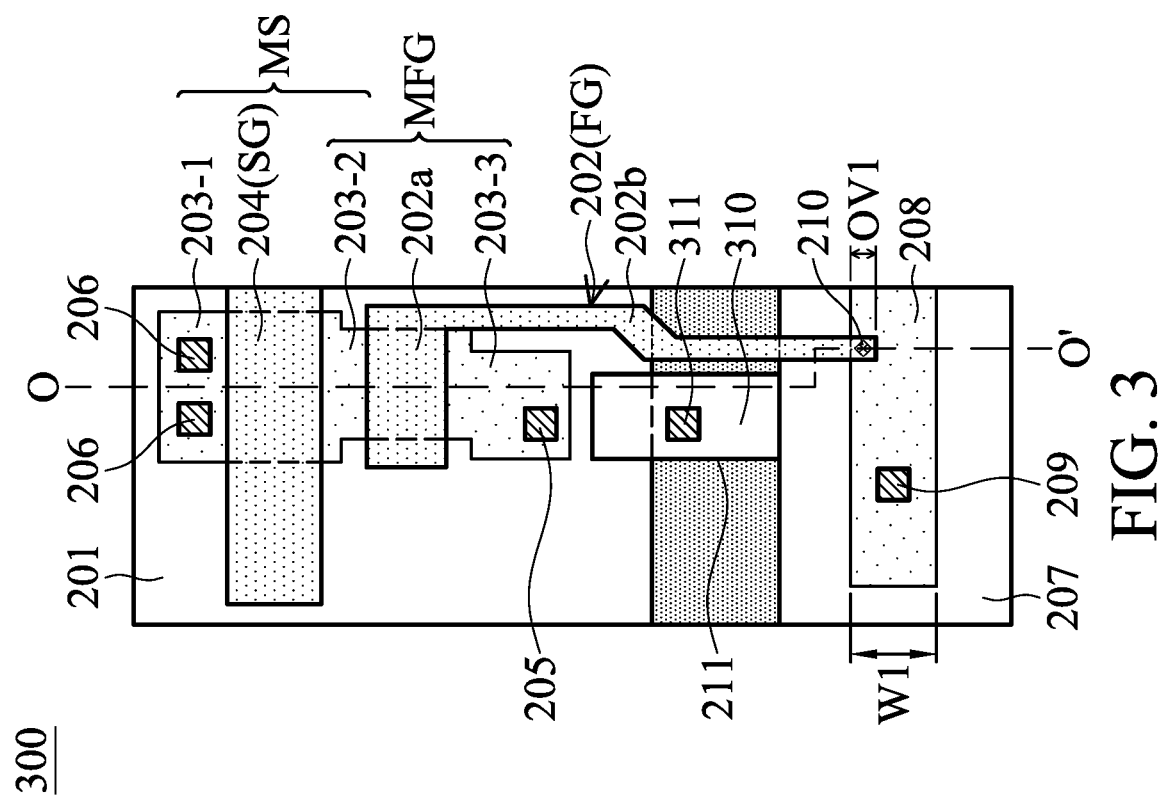
FIG. 3 illustrates a top view of a layout of the non-volatile memory cell in accordance with another embodiment of the invention.

FIG. 3 illustrates a top view of a layout of the non-volatile memory cell in accordance with another embodiment of the invention. Comparing FIG. 3 to FIG. 2, the non-volatile memory cell 300 further includes a first coupling structure 310, in which the first coupling structure 310 is formed by a third polysilicon layer 211. According to some embodiments of the invention, at least two of the first polysilicon layer 202, the second polysilicon layer 204, and the third polysilicon layer 211 are in the same polysilicon layer.

The first coupling structure 310 is deposited close to the first polysilicon layer 202, which is configured to increase the coupling rate to the floating gate FG (i.e., the first polysilicon layer 202 in FIG. 3). According to an embodiment of the invention, the first coupling structure 310 is coupled to the bit line BL. According to another embodiment of the invention, the first coupling structure 310 is coupled to an independently-controlled coupling voltage by at least one coupling contact 311.

According to other embodiments of the invention, the non-volatile memory cell 300 may further include a second coupling structure (not shown in FIG. 3) formed by a metal layer, which is fully, or partially, covering the first polysilicon layer 202 (i.e., the floating gate FG). According to an embodiment of the invention, the second coupling structure is coupled to the bit line BL. According to another embodiment of the invention, the first coupling structure 310 and the second coupling structure are coupled to the independently-controlled coupling voltage. According to other embodiments of the invention, the first coupling structure 310 and the second coupling structure may be biased individually.

Figure 4A:
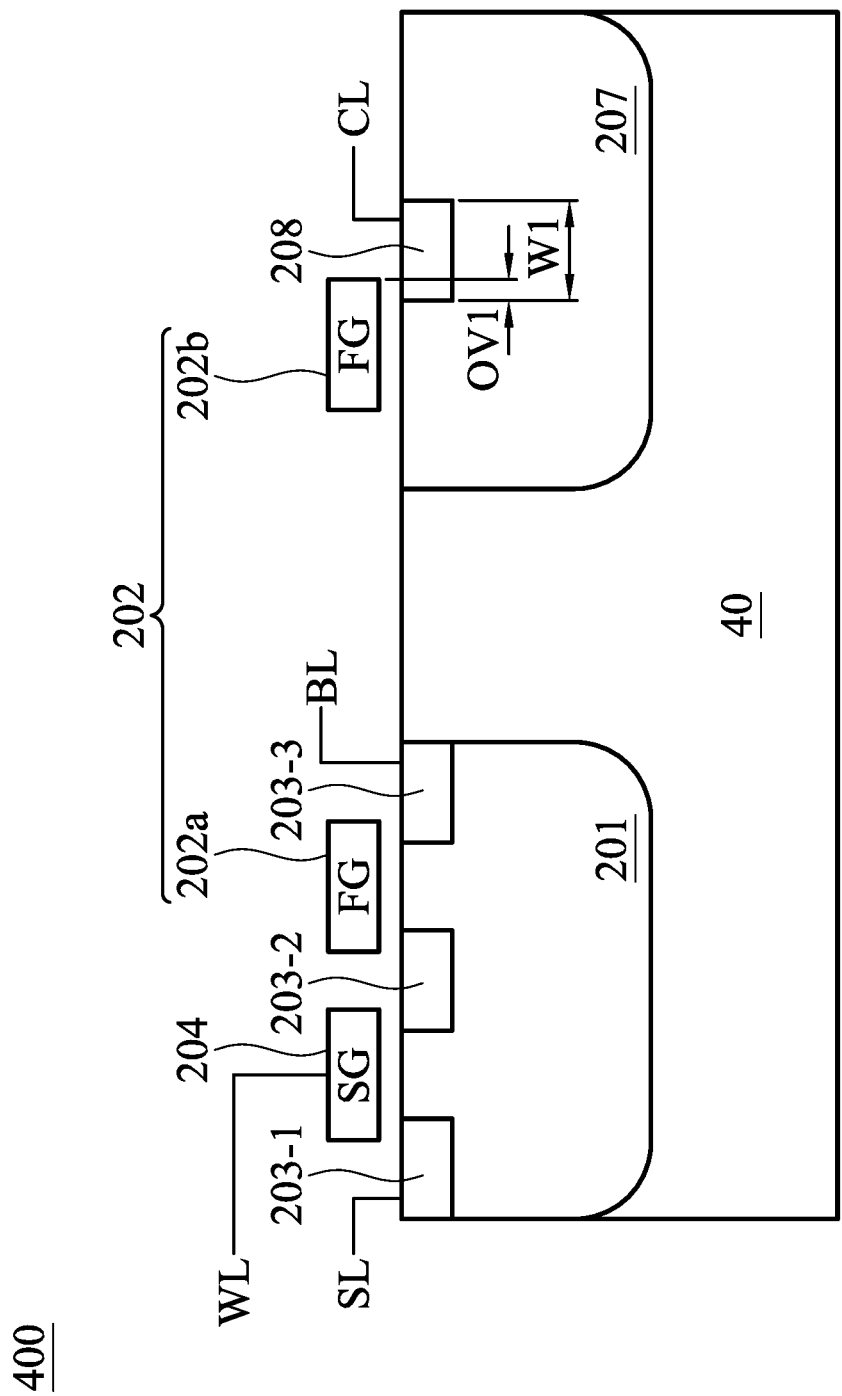
FIGS. 4A-4B show a cross-sectional view of a non-volatile memory cell in accordance with an embodiment of the invention.
Figure 4B:
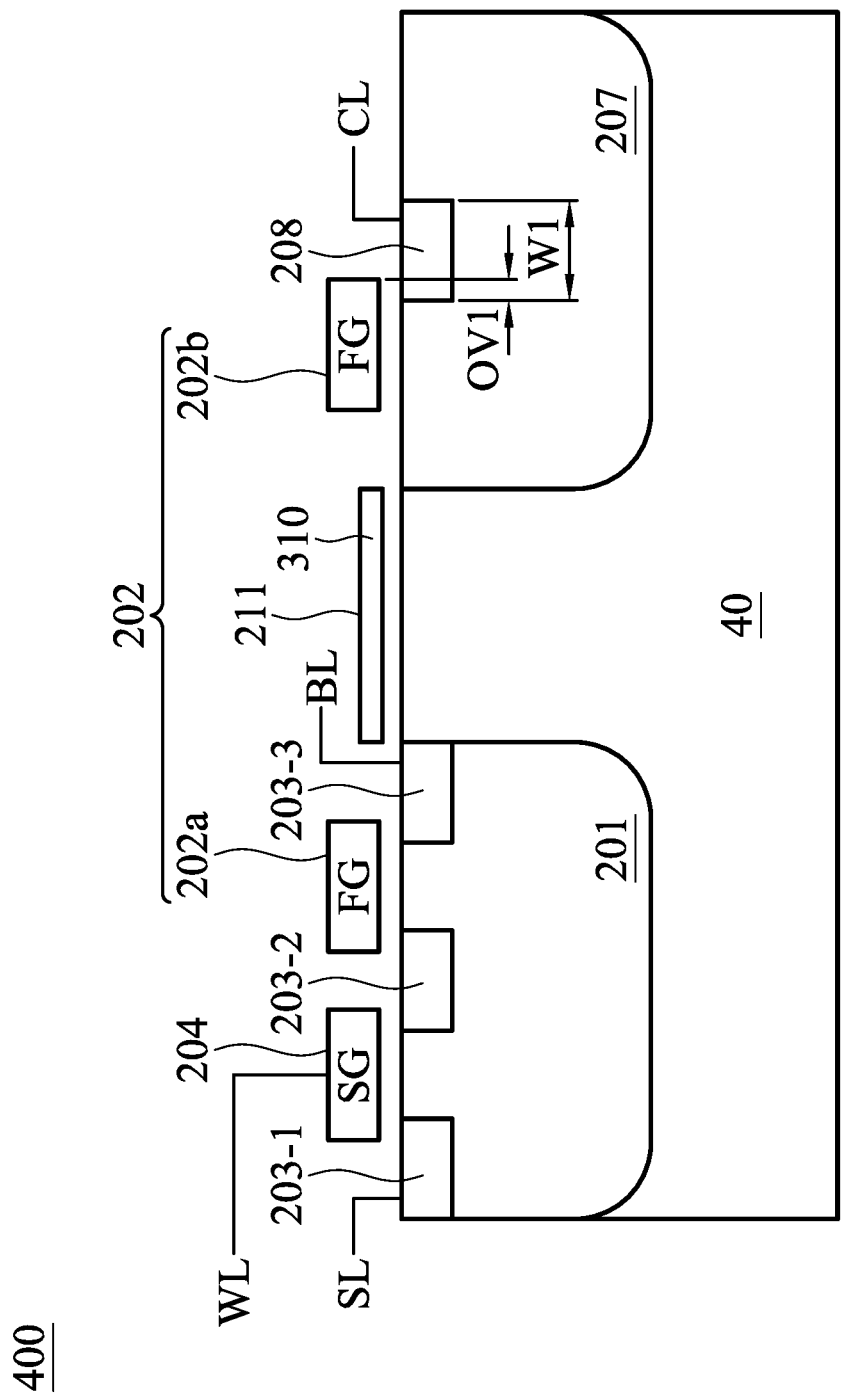

FIGS. 4A-4B show a cross-sectional view of a non-volatile memory cell in accordance with an embodiment of the invention. According to an embodiment of the invention, the non-volatile memory cell 400A in FIG. 4A is a cross-sectional view along the dot line from O to O' in FIG. 2, which indicates that the non-volatile memory cell 400A corresponds to the non-volatile memory cell 200 in FIG. 2.

As shown in FIG. 4A, the non-volatile memory 400A is formed on a substrate 40. According to an embodiment of the invention, the substrate 40 is N-type. According to another embodiment of the invention, the substrate 40 is P-type. The P-well 201 and the N-well 207 are deposited apart in the substrate 40.

The first N-type doped region 203-1, the second N-type doped region 203-2, and the third N-type doped region 203-3 are deposited in the P-well 201. The first part 202a of the first polysilicon layer 202 overlaps the second N-type doped region 203-2 and the third N-type doped region 203-3 to form the floating-gate transistor MFG in FIG. 1.

The second polysilicon layer 204 overlaps the first N-type doped region 203-1 and the second N-type doped region 203-2 to form the select transistor MS in FIG. 1, in which the second polysilicon layer 204 corresponds to the select gate SG.

Referring to FIG. 2, the second part 202b of the first polysilicon layer 202 is extended from the P-well 201 to the N-well 207. Therefore, the second part 202b is also deposited on the N-well 207 in FIG. 4A. As shown in FIG. 4A, the second part 202b has the first overlap width OV1 which is less than the first width W1 of the P-type doped region 208. According to another embodiment of the invention, the first overlap width OV1 may be equal to the width of the P-type doped region 208.

As shown in FIG. 4B, the non-volatile memory cell 400B, which corresponds to the non-volatile memory cell 300, may further include a first coupling structure 310 formed close to the first polysilicon layer 202, in order to increase the coupling rate to the floating gate FG. According to an embodiment of the invention, the first coupling structure 310 is coupled to the bit line BL. According to another embodiment of the invention, the first coupling structure 310 is coupled to an independently-controlled coupling voltage.

As shown in FIGS. 4A and 4B, the select gate SG is coupled to the word line WL, the first N-type doped region 203-1 is coupled to the source line SL, the third N-type doped region 203-3 is coupled to the bit line BL, and the P-type doped region 208 is coupled to the control line CL.

When the non-volatile memory cell 400 is in the read mode, a first positive voltage VP1 is applied to the word line WL, the bit line BL, the control line CL, and the N-well 207 while the source line SL and the P-well 201 are coupled to the ground. According to an embodiment of the invention, the non-volatile memory cell 400 is implemented in a CMOS process, and the first positive voltage VP1 is less than the breakdown voltage of the CMOS process.

According to an embodiment of the invention, when electrons are trapped in the floating gate FG, the floating-gate transistor MFG is OFF such that the current detected in the bit line BL is less than a threshold. That is, the data stored in non-volatile memory cell 400 is logic "0".

According to another embodiment of the invention, when electrons are ejected from the floating gate FG, the floating-gate transistor MFG is ON such that the current detected in the bit line BL exceeds a threshold. That is, the data stored in non-volatile memory cell 400 is logic "1".

When the non-volatile memory cell 400 is in the program mode, the P-well 201 and the N-well 207 are coupled to the ground, a second positive voltage VP2 is applied to the word line WL, the source line SL, and the bit line BL, while a first negative voltage VN1 is applied to the control line CL. According to an embodiment of the invention, the non-volatile memory cell 400 is implemented in a CMOS process, and the second positive voltage VP2 and the absolute value of the first negative voltage VN1 are lower than the breakdown voltage of the CMOS process. In addition, the second positive voltage VP2 and the absolute value of the first negative voltage VN1 exceed the first positive voltage VP1.

According to an embodiment of the invention, when the non-volatile memory cell 400 is in the program mode, the electrons will be injected into the first polysilicon layer 202 (i.e., the floating gate FG) from the control line CL. Therefore, the control line CL is biased with the first negative voltage VN1 such that the electrons are injected into the floating gate FG from the first overlapped area 210.

According to an embodiment of the invention, when the non-volatile memory cell 400 is in the erase mode, a third positive voltage VP3 is applied to the control line CL and the N-well 207 while the word line WL, the source line SL, the bit line BL, and the P-well 201 are coupled to the ground. According to an embodiment of the invention, the third positive voltage VP3 exceeds the breakdown voltage of the non-volatile memory cell 400.

Since the electrons will be ejected from the floating gate FG to the control line CL, the control line CL is biased with a high voltage to absorb the electrons from the floating gate FG. In addition, power transistors having a higher breakdown voltage are required to generate the third positive voltage VP3 exceeding the breakdown voltage. However, driving circuits with the power transistors are chip area consumption, such that the third positive voltage VP3 should be lowered to mitigate the chip area consumption.

According to another embodiment of the invention, when the non-volatile memory cell 400 is in the erase mode, a fourth positive voltage VP4 is applied to the control line CL and the N-well 207 while a second negative voltage VN2 is applied to the word line WL, the source line SL, the bit line BL, and the P-well 201 such that electrons are ejected from the floating gate FG to the control line CL.

According to an embodiment of the invention, the fourth positive voltage VP4 and the absolute value of the second negative voltage VN2 are lower than the breakdown voltage of the non-volatile memory cell 400. Since the fourth positive voltage VP4 and the absolute value of the second negative voltage VN2 are lower than the breakdown voltage, power transistors are no longer required, and the chip area may be reduced.

According to an embodiment of the invention, a sum of the fourth positive voltage VP4 and the absolute value of the second negative voltage VN2 may be equal to the third positive voltage VP3. According to some embodiments of the invention, the third positive voltage VP3 exceeds the second positive voltage VP2, the absolute value of the first negative voltage VN1, the fourth positive voltage VP4, and the absolute value of the second negative voltage VN2.

The bias voltages of the non-volatile memory cell 400 in the read mode, the program mode, and the erase mode are as summarized in Table 1.

TABLE 1

|  | Read Mode | Program Mode | Erase Mode Type-1 | Erase Mode Type-2 |
|---|---|---|---|---|
| WL | VP1 | VP2 | 0 | VN2 |
| SL | 0 | VP2 | 0 | VN2 |
| BL | VP1 | VP2 | 0 | VN2 |
| P-well | 0 | 0 | 0 | VN2 |
| CL | VP1 | VN1 | VP3 | VP4 |
| N-well | VP1 | 0 | VP3 | VP4 |

According to an embodiment of the invention, the non-volatile memory cell 300 is programmed and erased by Fowler-Nordheim method such that the non-volatile memory cell 300 may achieve low power consumption.

Figure 5:
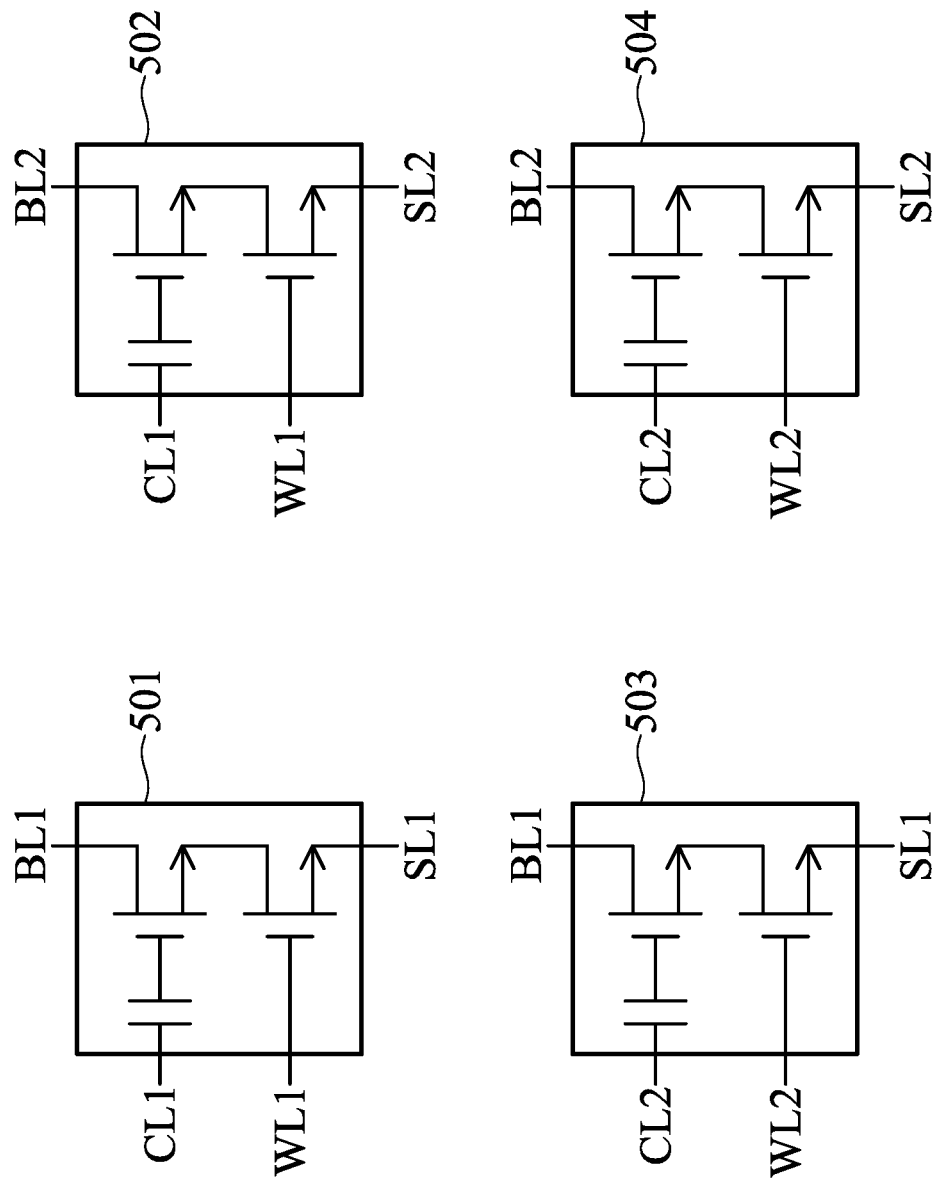
FIG. 5 is a schematic diagram of a non-volatile memory array in accordance with an embodiment of the invention.

FIG. 5 is a schematic diagram of a non-volatile memory array in accordance with an embodiment of the invention. As shown in FIG. 5, the non-volatile memory array 500 includes a first non-volatile memory cell 501, a second non-volatile memory cell 502, a third non-volatile memory cell 503, and a fourth non-volatile memory cell 504, in which each of the first non-volatile memory cell 501, the second non-volatile memory cell 502, the third non-volatile memory cell 503, and the fourth non-volatile memory cell 504 corresponds to the non-volatile memory cell 100 in FIG. 1.

According to other embodiments of the invention, the position and/or quantity of the non-volatile memory cells may vary. For example, the non-volatile memory array 500 may include more than four non-volatile memory cells arranged in matrix. The first non-volatile memory cell 501, the second non-volatile memory cell 502, the third non-volatile memory cell 503, and the fourth non-volatile memory cell 504 are illustrated herein for the simplicity of explanation.

As shown in FIG. 5, the first word line WL1 and the first control line CL1 are coupled to the first non-volatile memory cell 501 and the second non-volatile memory cell 502 while the second word line WL2 and the second control line CL2 are coupled to the third non-volatile memory cell 503 and the fourth non-volatile memory cell 504.

The first bit line BL1 and the first source line SL1 are coupled to the first non-volatile memory cell 501 and the third non-volatile memory cell 503 while the second bit line BL2 and the second source line SL2 are coupled to the second non-volatile memory cell 502 and the fourth non-volatile memory cell 504.

Figure 6:
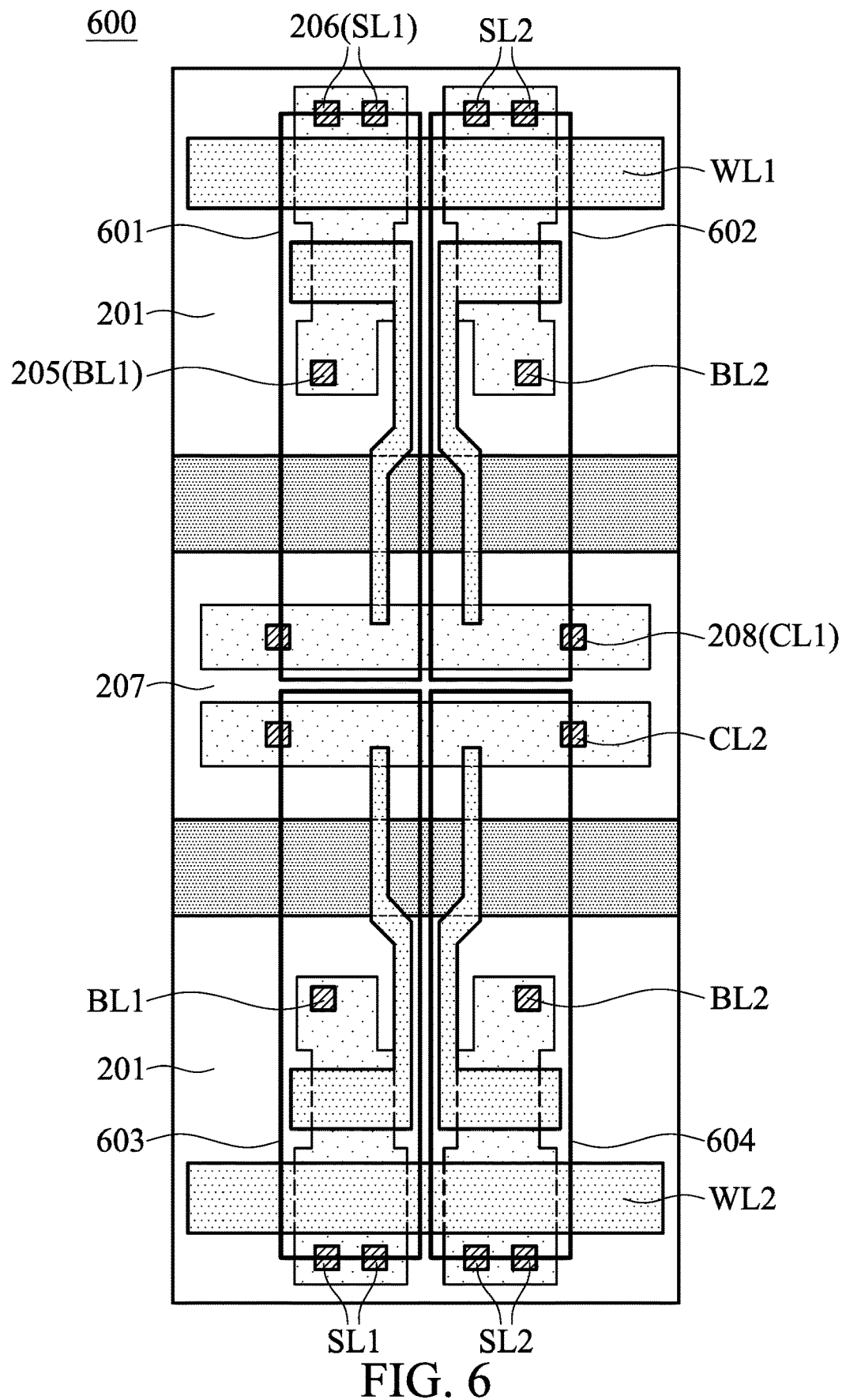
FIG. 6 illustrates a top view of a layout of the non-volatile memory array in accordance with an embodiment of the invention.

FIG. 6 illustrates a top view of a layout of the non-volatile memory array in accordance with an embodiment of the invention. According to an embodiment of the invention, the non-volatile memory array 600 corresponds to the non-volatile memory array 500. The non-volatile memory array 600 includes a first non-volatile memory cell 601, a second non-volatile memory cell 602, a third non-volatile memory cell 603, and a fourth non-volatile memory cell 604.

According to an embodiment of the invention, each of the first non-volatile memory cell 601, the second non-volatile memory cell 602, the third non-volatile memory cell 603, and the fourth non-volatile memory cell 604 corresponds to the non-volatile memory cell 200 in FIG. 2. According to another embodiment of the invention, each of the first non-volatile memory cell 601, the second non-volatile memory cell 602, the third non-volatile memory cell 603, and the fourth non-volatile memory cell 604 may correspond to the non-volatile memory cell 300 in FIG. 3.

The first non-volatile memory cell 601, the second non-volatile memory cell 602, the third non-volatile memory cell 603, and the fourth non-volatile memory cell 604 correspond to the first non-volatile memory cell 501, the second non-volatile memory cell 502, the third non-volatile memory cell 503, and the fourth non-volatile memory cell 504 in FIG. 5 respectively.

As shown in FIG. 6, the non-volatile memory array 600 is deposited in the P-well 201 and the N-well 207, which are deposited apart. The first non-volatile memory cell 601 and the second non-volatile memory cell 602 share the select gate SG (i.e., the second polysilicon layer 204) which is coupled to the first word line WL1. The bit-line contact 205 of the first non-volatile memory cell 601 is coupled to the first bit line BL1, and the bit-line contact 205 of the second non-volatile memory cell 602 is coupled to the second bit line BL2.

The source-line contact 206 of the first non-volatile memory cell 601 is coupled to the first source line SL1, and the source-line contact 206 of the second non-volatile memory cell 602 is coupled to the second source line SL2. The first non-volatile memory cell 601 and the second non-volatile memory cell 602 also share the control gate CG (i.e., the P-type doped region 208) which is coupled to the first control line CL1.

The third non-volatile memory cell 603 and the fourth non-volatile memory cell 604 are illustrated in FIG. 6, which is not repeated herein. It should be noted that the non-volatile memory array 600 is illustrated for the simplicity of explanation, so that the first non-volatile memory cell 601, the second non-volatile memory cell 602, the third non-volatile memory cell 603, and the fourth non-volatile memory cell 604 are deposited in the same P-well 201.

According to an embodiment of the invention, when the first non-volatile memory cell 601 in FIG. 6 is in the program mode, the P-well 201 and N-well 207 are coupled to the ground, the second positive voltage VP2 is applied to the first word line WL1, the first source line SL1, and the first bit line BL1, while a first negative voltage VN1 is applied to the first control line CL1 such that electrons are injected into the floating gate FG of the first non-volatile memory cell 601 from the first control line CL1. Therefore, the voltage across the floating gate FG of the first non-volatile memory cell 601 is a sum of the second positive voltage VP2 and the absolute value of the first negative voltage VN1.

In order to inhibit the second non-volatile memory cell 602, the third non-volatile memory cell 603, and the fourth non-volatile memory cell 604 from being programmed along with the first non-volatile memory cell 601, the second bit line BL2, the second source line SL2, the second word line WL2, and the second control line CL2 are coupled to the ground.

Therefore, the voltage across the floating gate FG of the second non-volatile memory cell 602 is the absolute value of the first negative voltage VN1 and those of the third non-volatile memory cell 603 and the fourth non-volatile memory cell 604 are 0V such that the second non-volatile memory cell 602, the third non-volatile memory cell 603, and the fourth non-volatile memory cell 604 are inhibited from being programmed at the same time.

When the first non-volatile memory cell 601 is in the program mode, the bias voltages of the first non-volatile memory cell 601, the second non-volatile memory cell 602, the third non-volatile memory cell 603, and the fourth non-volatile memory cell 604 with separated source lines are as summarized in Table 2.

TABLE 2

|  | 601 | 602 | 603 | 604 |
|---|---|---|---|---|
| WL | VP2 | VP2 | 0 | 0 |
| SL | VP2 | 0 | VP2 | 0 |
| BL | VP2 | 0 | VP2 | 0 |
| P-well | 0 | 0 | 0 | 0 |
| CL | VN1 | VN1 | 0 | 0 |
| N-well | 0 | 0 | 0 | 0 |

According to an embodiment of the invention, when the first non-volatile memory cell 601 is in the erase mode, the third positive voltage VP3 is applied to the first control line CL1 and the N-well 207 while the first word line WL1, the first source line SL1, the first bit line BL1, and the P-well 201 are coupled to the ground such that electrons can be ejected from the floating gate FG of the first non-volatile memory cell 601 to the first control line CL1. According to an embodiment of the invention, the third positive voltage VP3 exceeds the breakdown voltage of the non-volatile memory cell 600.

In order to inhibit the second non-volatile memory cell 602, the third non-volatile memory cell 603, and the fourth non-volatile memory cell 604 from being erased along with the first non-volatile memory cell 601, the second word line WL2 is coupled to the ground while a fourth positive voltage VP4 is applied to the second bit line BL2, the second source line SL2, and the second control line CL2. According to an embodiment of the invention, the fourth positive voltage VP4 is less than the breakdown voltage of the non-volatile memory array 600, and the difference between the third positive voltage VP3 and the fourth positive voltage VP4 is less than the breakdown voltage.

Since the second non-volatile memory cell 602 shares the first control line CL1 with the first non-volatile memory 601, the second bit line BL2 and the second source line SL2 are coupled to the fourth positive voltage VP4 such that the voltage across the floating gate FG of the second non-volatile memory cell 602 is lower.

Even though the third non-volatile memory cell 603 and the fourth non-volatile memory cell 604 are coupled to the second control line CL2, however, the non-volatile memory array 600 is formed in the N-well 207, the second control line CL2 is coupled to the fourth positive voltage VP4 to prevent the junction between the P-type doped region 208, which is coupled to the second control line CL2, and the N-well 207 from breakdown.

In addition, the voltage across the floating gate FG of the third non-volatile memory cell 603 is the fourth positive voltage VP4 and that of the fourth non-volatile memory cell 604 is 0V, so that the third non-volatile memory cell 603 and the fourth non-volatile memory cell 604 are inhibited to be erased.

When the first non-volatile memory cell 601 is in the erase mode in accordance with an embodiment of the invention, the bias voltages of the first non-volatile memory cell 601, the second non-volatile memory cell 602, the third non-volatile memory cell 603, and the fourth non-volatile memory cell 604 with separated source lines are as summarized in Table 3.

TABLE 3

|  | 601 | 602 | 603 | 604 |
|---|---|---|---|---|
| WL | 0 | 0 | 0 | 0 |
| SL | 0 | VP4 | 0 | VP4 |

TABLE 3-continued

|  | 601 | 602 | 603 | 604 |
|---|---|---|---|---|
| BL | 0 | VP4 | 0 | VP4 |
| P-well | 0 | 0 | 0 | 0 |
| CL | VP3 | VP3 | VP4 | VP4 |
| N-well | VP3 | VP3 | VP3 | VP3 |

According to another embodiment of the invention, when the first non-volatile memory cell 601 is in the erase mode, the fourth positive voltage VP4 is applied to the first control line CL1 and the N-well 207 while a second negative voltage VN2 is applied to the first word line WL1, the first source line SL1, the first bit line BL1, and the P-well 201 such that the electrons are ejected from the floating gate FG of the first non-volatile memory cell 601 to the first control line CL1.

According to other embodiments of the invention, the first word line WL1 may be coupled to the ground or the second negative voltage VN2. According to an embodiment of the invention, the fourth positive voltage VP4 and the absolute value of the second negative voltage VN2 are lower than the breakdown voltage of the non-volatile memory array 600 and exceed the first positive voltage VP1.

Since the second non-volatile memory cell 602 shares the first control line CL1 with the first non-volatile memory 601, the second bit line BL2 and the second source line SL2 are coupled to the ground such that the voltage across the floating gate FG of the second non-volatile memory cell 602 is lower.

Since the third non-volatile memory cell 603 and the fourth non-volatile memory cell 604 are coupled to the second word line WL2 and the second control line CL2, the second word line WL2 and the second control line CL2 are coupled to the ground to prevent lower the voltages across the floating gates FG of the third non-volatile memory cell 603 and the fourth non-volatile memory cell 604. According to other embodiments of the invention, the second word line WL2 may be coupled to the ground or the second negative voltage VN2.

When the first non-volatile memory cell 601 is in the erase mode in accordance with another embodiment of the invention, the bias voltages of the first non-volatile memory cell 601, the second non-volatile memory cell 602, the third non-volatile memory cell 603, and the fourth non-volatile memory cell 604 with separated source lines are as summarized in Table 4.

TABLE 4

|  | 601 | 602 | 603 | 604 |
|---|---|---|---|---|
| WL | 0 or VN2 | 0 or VN2 | 0 or VN2 | 0 or VN2 |
| SL | VN2 | 0 | VN2 | 0 |
| BL | VN2 | 0 | VN2 | 0 |
| P-well | VN2 | VN2 | VN2 | VN2 |
| CL | VP4 | VP4 | 0 | 0 |
| N-well | VP4 | VP4 | VP4 | VP4 |

Figure 7:
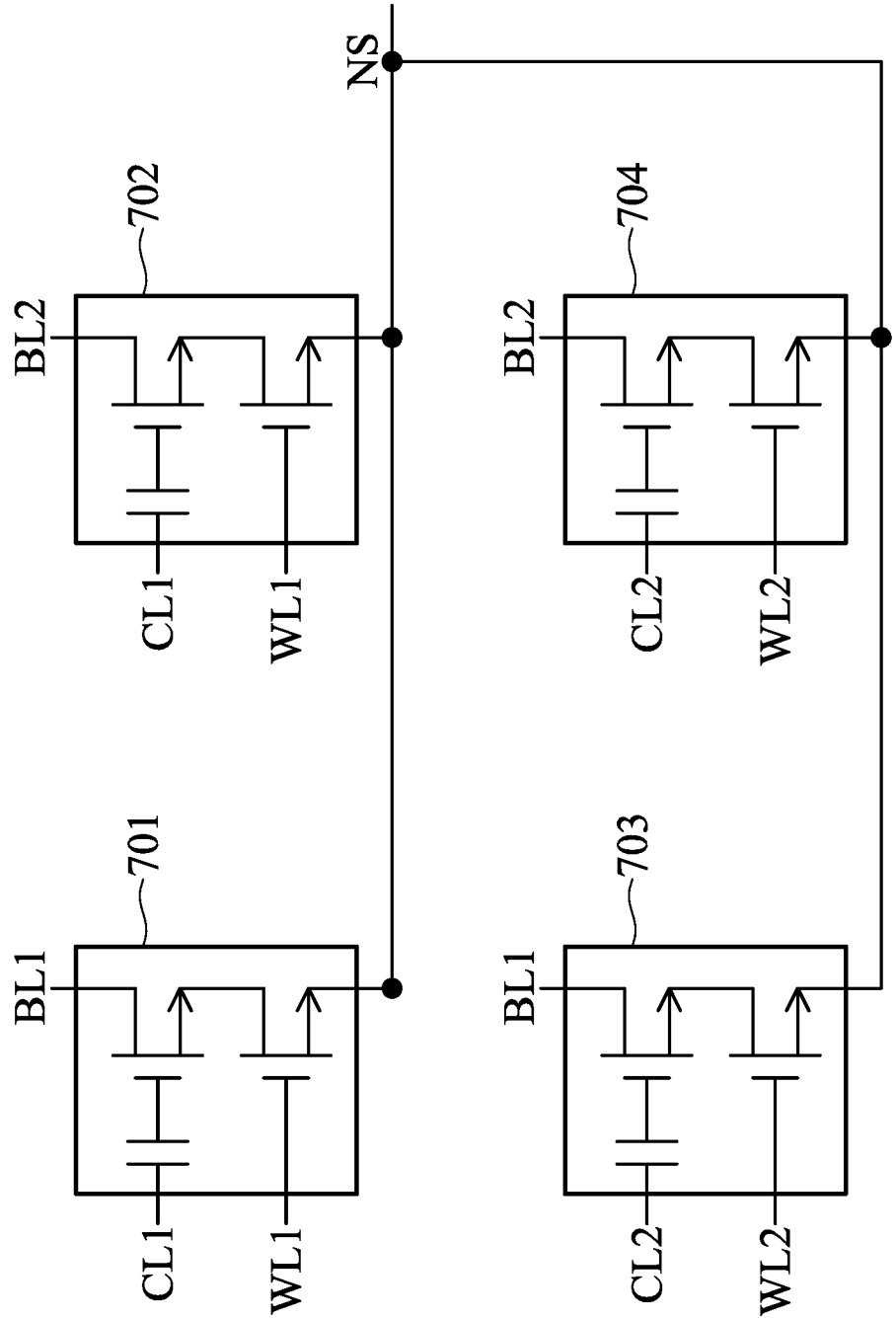
FIG. 7 is a schematic diagram of a non-volatile memory array in accordance with another embodiment of the invention.

FIG. 7 is a schematic diagram of a non-volatile memory array in accordance with another embodiment of the invention. Comparing the non-volatile memory array 700 to the non-volatile memory array 500 in FIG. 5, the first source line SL1 and the second source line SL2 in FIG. 5 are coupled to a source node NS in FIG. 7.

As shown in FIG. 7, the non-volatile memory array 700 includes a first non-volatile memory cell 701, a second non-volatile memory cell 702, a third non-volatile memory cell 703, and a fourth non-volatile memory cell 704 which correspond to the first non-volatile memory cell 601, the second non-volatile memory cell 602, the third non-volatile memory cell 603, and the fourth non-volatile memory cell 604 in FIG. 6.

In addition, the layout of the non-volatile memory array 700 may be illustrated by the non-volatile memory array 600 in FIG. 6, except the first source line SL1 and the second source line SL2 are coupled to the source node NS. In other words, the first source line SL1 and the second source line SL2 of the non-volatile memory array 600 are coupled to the source node NS to be the non-volatile memory array 700. Therefore, the chip area occupied by the source lines can be significantly reduced when all the source lines are coupled to a single node.

In the following paragraphs describing the non-volatile memory array 700 in the program mode and the erase mode, the non-volatile memory array 600 in FIG. 6 is illustrated with the first source line SL1 and the second source line SL2 coupled to the source node NS.

According to an embodiment of the invention, when the first non-volatile memory cell 601 is in the program mode, the first word line WL1, the source node NS, the P-well 201 and N-well 207 are coupled to the ground, the second positive voltage VP2 is applied to the bit line BL1, while a first negative voltage VN1 is applied to the first control line CL1.

In order to inhibit the second non-volatile memory cell 602, the third non-volatile memory cell 603, and the fourth non-volatile memory cell 604 from being programmed along with the first non-volatile memory cell 601, the second word line WL2, the second bit line BL2, and the second control line CL2 are coupled to the ground.

Since the non-volatile memory array 600 has a single source node NS, the source node NS should be coupled to the ground to inhibit second non-volatile memory cell 602, the third non-volatile memory cell 603, and the fourth non-volatile memory cell 604 from being programmed, when the source node NS is coupled to the ground.

When the first non-volatile memory cell 601 is in the program mode in accordance with an embodiment of the invention, the bias voltages of the first non-volatile memory cell 601, the second non-volatile memory cell 602, the third non-volatile memory cell 603, and the fourth non-volatile memory cell 604 with a common source node NS are as summarized in Table 5.

TABLE 5

|        | 601 | 602 | 603 | 604 |
|--------|-----|-----|-----|-----|
| WL     | 0   | 0   | 0   | 0   |
| SL     | 0   | 0   | 0   | 0   |
| BL     | VP2 | 0   | VP2 | 0   |
| P-well | 0   | 0   | 0   | 0   |
| CL     | VN1 | VN1 | 0   | 0   |
| N-well | 0   | 0   | 0   | 0   |

According to an embodiment of the invention, when the first non-volatile memory cell 601 is in the erase mode, the third positive voltage VP3 is applied to the first control line CL1 and the N-well 207, a fourth positive voltage VP4 is applied to the source node NS, while the first word line WL1, the first bit line BL1, and the P-well 201 are coupled to the ground such that electrons can be ejected from the floating gate FG of the first non-volatile memory cell 601 to the first control line CL1.

According to an embodiment of the invention, the third positive voltage VP3 exceeds the breakdown voltage of the non-volatile memory cell 600, the fourth positive voltage VP4 is less than the breakdown voltage, and the difference between the third positive voltage VP3 and the fourth positive voltage VP4 is less than the breakdown voltage.

In order to inhibit the second non-volatile memory cell 602, the third non-volatile memory cell 603, and the fourth non-volatile memory cell 604 from being erased along with the first non-volatile memory cell 601, the second word line WL2 is coupled to the ground while the fourth positive voltage VP4 is applied to the second bit line BL2 and the second control line CL2.

Since the non-volatile memory array 600 shares the source node NS and the first non-volatile memory cell 601 and the second non-volatile memory cell 602 share the first control line CL1, the source node NS and the second bit line BL2 should be supplied by the fourth voltage VP4 to prevent the second non-volatile memory cell 602 from being erased along with the first non-volatile memory cell 601.

In other words, the voltage across the floating gate of the second non-volatile memory cell 602 is equal to the voltage of the third positive voltage VP3 minus the fourth positive voltage VP4. When the first non-volatile memory cell 601 is in the erase mode in accordance with an embodiment of the invention, the bias voltages of the first non-volatile memory cell 601, the second non-volatile memory cell 602, the third non-volatile memory cell 603, and the fourth non-volatile memory cell 604 with a common source node are as summarized in Table 6.

TABLE 6

|        | 601      | 602      | 603      | 604      |
|--------|----------|----------|----------|----------|
| WL     | 0        | 0        | 0        | 0        |
| SL     | VP4 or 0 | VP4 or 0 | VP4 or 0 | VP4 or 0 |
| BL     | 0        | VP4      | 0        | VP4      |
| P-well | 0        | 0        | 0        | 0        |
| CL     | VP3      | VP3      | VP4      | VP4      |
| N-well | VP3      | VP3      | VP3      | VP3      |

According to another embodiment of the invention, when the first non-volatile memory cell 601 is in the erase mode, the source node NS is coupled to the ground, the fourth positive voltage VP4 is applied to the first control line CL1 and the N-well 207 while a second negative voltage VN2 is applied to the first word line WL1, the first bit line BL1, and the P-well 201 such that the electrons are ejected from the floating gate FG of the first non-volatile memory cell 601 to the first control line CL1.

According to an embodiment of the invention, the fourth positive voltage VP4 and the absolute value of the second negative voltage VN2 are lower than the breakdown voltage of the non-volatile memory array 600 and exceed the first positive voltage VP1.

In order to inhibit the second non-volatile memory cell 602, the third non-volatile memory cell 603, and the fourth non-volatile memory cell 604 from being erased along with the first non-volatile memory cell 601, the second bit line BL2, and the second control line CL2 are coupled to the ground while the second negative voltage VN2 is applied to the second word line WL2.

The first bit line BL1 is supplied by the second negative voltage VN2. The first word line WL1 and the second word line WL2 are supplied by the second negative voltage VN2 to prevent the second negative voltage VN2 shorted to the ground.

When the first non-volatile memory cell 601 is in the erase mode in accordance with another embodiment of the invention, the bias voltages of the first non-volatile memory cell 601, the second non-volatile memory cell 602, the third non-volatile memory cell 603, and the fourth non-volatile memory cell 604 with a common source node are as summarized in Table 7.

TABLE 7

|        | 601      | 602      | 603      | 604      |
|--------|----------|----------|----------|----------|
| WL     | VN2      | VN2      | VN2      | VN2      |
| SL     | 0 or VN2 | 0 or VN2 | 0 or VN2 | 0 or VN2 |
| BL     | VN2      | 0        | VN2      | 0        |
| P-well | VN2      | VN2      | VN2      | VN2      |
| CL     | VP4      | VP4      | 0        | 0        |
| N-well | VP4      | VP4      | VP4      | VP4      |

Figure 8:
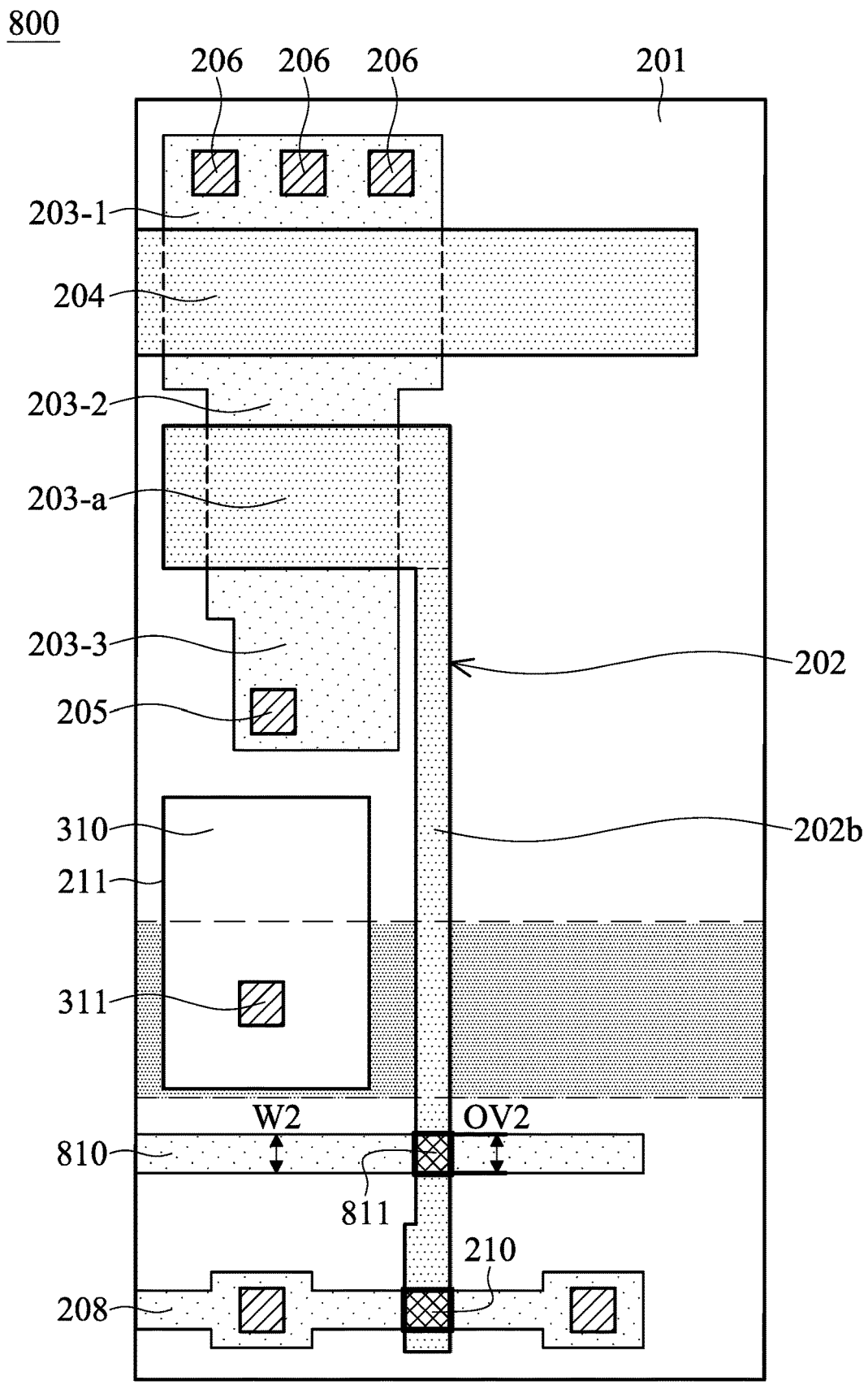
FIG. 8 illustrates a top view of a layout of the non-volatile memory cell in accordance with another embodiment of the invention.

FIG. 8 illustrates a top view of a layout of the non-volatile memory cell in accordance with another embodiment of the invention. Comparing FIG. 8 to FIG. 3, the non-volatile memory cell 800 further includes an N-type doped region 810 deposited in the N-well 207.

As shown in FIG. 8, the second part 202b of the first polysilicon layer 202 (i.e., the floating gate FG) overlaps the N-type doped region 810 and the P-type doped region 208. The second part 202b includes a second overlapped area 811 that is overlapped with the N-type doped region 810. As shown in FIG. 8, the second overlapped area 811 has a second overlap width OV2 equal to a second width W2 of the N-type doped region 810.

According to an embodiment of the invention, when the non-volatile memory cell 800 is in the program mode, the electrons are injected into the floating gate FG (i.e., the first polysilicon layer 202) from the first overlapped area 210. According to another embodiment of the invention, when the non-volatile memory cell 800 is in the erase mode, the electrons in the floating gate FG is ejected to the N-well 207 through the second overlapped area 811 of the N-type doped region 810.

In other words, the non-volatile memory cell 800 is programmed through the first overlapped area 210 of the P-type doped region 208, and is erased through the second overlapped area 811 of the N-type doped region 810. According to other embodiments of the invention, when a non-volatile memory array including a plurality of the non-volatile memory cells 800 is in the erase mode, the whole non-volatile memory array should be erased at the same time, since all the non-volatile memory cells 800 is deposited in the N-well 207 and the N-type doped region 810 and the N-well 207 possess the identical voltage level.

When one of the non-volatile memory cells 800 of the non-volatile memory array is in the erase mode, the N-well 207 is supplied by the third positive voltage VP3. In addition, all the non-volatile memory cells 800 of the non-volatile memory array are deposited in the N-well 207 such that all the non-volatile memory cells 800 of the non-volatile memory array should be erased at the same time.

The bias voltages of the non-volatile memory cell 800 in the read mode, the program mode, and the erase mode are summarized in Table 8.

TABLE 8

|    | Read Mode | Program Mode | Erase Mode Type-1 |
|----|-----------|--------------|-------------------|
| WL | VP1       | 0            | 0                 |
| SL | 0         | 0            | 0                 |

TABLE 8-continued

|        | Read Mode | Program Mode | Erase Mode Type-1 |
|--------|-----------|--------------|-------------------|
| BL     | VP1       | VP2          | 0                 |
| P-well | 0         | 0            | 0                 |
| CL     | VP1       | VN1          | VP4               |
| N-well | VP1       | 0            | VP3               |

Comparing Table 8 to Table 1, the control line CL is supplied by the fourth positive voltage VP4 in the Type-1 erase mode, instead of the third positive voltage VP3. Since the electrons are ejected through the N-type doped region 811, the voltage of the control line CL should be as low as possible without exceeding the breakdown voltage of the non-volatile memory cell 800. Therefore, the control line CL is supplied by the fourth positive voltage VP4 such that the voltage difference between the P-type doped region 208 and the N-well 207 is less than the breakdown voltage.

Embodiments of the invention provide a non-volatile memory cell that has low power consumption, that can be programmed by page or byte, and that is suitable for any type of substrate. According to an embodiment of the invention, the non-volatile memory cell provided herein is implemented by a regular CMOS process. According to an embodiment of the invention, since the read path is different from the program path and the erase path, the endurance of the non-volatile memory cell provided herein should be very high. According to some embodiments of the invention, the non-volatile memory cell provided herein can be implemented on P-type or N-type substrate. According to other embodiments of the invention, the non-volatile memory cell provided herein can be implemented on a deep N-well.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A non-volatile memory cell, comprising:
a floating-gate transistor, deposited in a P-well and comprising a gate terminal, a drain terminal, and a source terminal, wherein the gate terminal is coupled to a floating gate, the drain terminal is coupled to a bit line, and the source terminal is coupled to a first node, wherein the floating gate is formed by a first polysilicon layer;
a select transistor, deposited in the P-well and comprising a gate terminal, a drain terminal, and a source terminal, wherein the gate terminal is coupled to a select gate, the drain terminal is coupled to the first node, and the source terminal is coupled to a source line, wherein the select gate is coupled to a word line, wherein the floating-gate transistor and the select transistor are N-type transistors; and
a coupling structure, formed by extending the first polysilicon layer to overlap a control gate, wherein the control gate is a P-type doped region in an N-well, wherein the control gate is coupled to a control line.

2. The non-volatile memory cell of claim 1, wherein the select gate is formed by a second polysilicon layer, and the select transistor is formed by the second polysilicon layer overlapped with a first N-type doped region and a second N-type doped region, wherein the first N-type doped region and the second N-type doped region are deposited in the P-well.

3. The non-volatile memory cell of claim 2, wherein the first polysilicon layer comprises a first part and a second part, and the floating-gate transistor is formed by the first part overlapped with the second N-type doped region and a third N-type doped region, wherein the third N-type doped region is deposited in the P-well.

4. The non-volatile memory cell of claim 3, wherein the second part extends from the P-well to the N-well, wherein the second part comprises a first overlapped area that overlaps with the P-type doped region, wherein the first overlapped area has a first overlap width, and the P-type doped region has a first width.

5. The non-volatile memory cell of claim 4, wherein the first overlap width is equal to or less than the first width.

6. The non-volatile memory cell of claim 4, further comprising:
an N-type doped region, formed in the N-well, wherein the second part further comprises a second overlapped area that overlaps with the N-type doped region, wherein the second overlapped area has a second overlap width and the N-type doped region has a second width, wherein the second overlap width is equal to the second width.

7. The non-volatile memory cell of claim 6, wherein when the non-volatile memory cell is in an erase mode, a third positive voltage is applied to the N-well, a fourth positive voltage is applied to the control line, while the word line, the source line, the bit line, and the P-well are coupled to a ground such that electrons are ejected from the floating gate to the N-well through the N-type doped region, wherein the third positive voltage exceeds a breakdown voltage, the fourth positive voltage is less than the breakdown voltage, and a difference between the third positive voltage and the fourth positive voltage is less than the breakdown voltage.

8. The non-volatile memory cell of claim 1, wherein the P-well is deposited apart from the N-well, wherein the P-well and the N-well are deposited in a substrate, wherein the substrate is either one of a P-type substrate, an N-type substrate, and a deep N-well.

9. The non-volatile memory cell of claim 1, wherein when the non-volatile memory cell is in a read mode, a first positive voltage is applied to the word line, the bit line, the control line, and the N-well, while the P-well and the source line are coupled to a ground.

10. The non-volatile memory cell of claim 9, wherein when the non-volatile memory cell is in a program mode, the N-well and the P-well are coupled to the ground, a second positive voltage is applied to the word line, the source line, and the bit line, and a first negative voltage is applied to the control line such that electrons are injected into the floating gate from the control line, wherein the second positive voltage and an absolute value of the first negative voltage are lower than a breakdown voltage and exceed the first positive voltage.

11. The non-volatile memory cell of claim 10, wherein when the non-volatile memory cell is in an erase mode, a third positive voltage is applied to the control line and the N-well while the word line, the source line, the bit line, and the P-well are coupled to a ground such that electrons are ejected from the floating gate to the control line, wherein the third positive voltage exceeds the breakdown voltage.

12. The non-volatile memory cell of claim 11, wherein when the non-volatile memory cell is in an erase mode, a fourth positive voltage is applied to the control line and the N-well while a second negative voltage is applied to the word line, the source line, the bit line, and the P-well such that electrons are ejected from the floating gate to the control line, wherein the fourth positive voltage and an absolute value of the second negative voltage are lower than the breakdown voltage.

13. The non-volatile memory cell of claim 1, further comprising:
a first coupling structure, formed by a third polysilicon layer and deposited close to the first polysilicon layer.

14. The non-volatile memory cell of claim 13, further comprising:
a second coupling structure, formed by a metal layer and covering the floating gate.

15. The non-volatile memory cell of claim 14, wherein the first coupling structure and the second coupling structure are coupled to the bit line.

16. The non-volatile memory array of claim 14, wherein the first coupling structure and the second coupling structure are coupled to an independently-controlled coupling voltage.

17. A non-volatile memory array, comprising:
a plurality of non-volatile memory cells, comprising at least a first non-volatile memory cell, a second non-volatile memory cell, a third non-volatile memory cell, and a fourth non-volatile memory cell, wherein each of the non-volatile memory cells comprises:
a floating-gate transistor, deposited in a P-well and comprising a gate terminal, a drain terminal, and a source terminal, wherein the gate terminal is coupled to a floating gate, the drain terminal is coupled to a bit line, and the source terminal is coupled to a first node, wherein the floating gate is a first polysilicon layer;
a select transistor, deposited in the P-well and comprising a gate terminal, a drain terminal, and a source terminal, wherein the gate terminal is coupled to a select gate, the drain terminal is coupled to the first node, and the source terminal is coupled to a source line, wherein the select gate is coupled to a word line, wherein the floating-gate transistor and the select transistor are N-type transistors; and
a coupling structure, formed by extending the first polysilicon layer to overlap a control gate, wherein the control gate is a P-type doped region in an N-well, wherein the control gate is coupled to a control line.

18. The non-volatile memory array of claim 17, wherein the select gate is formed by a second polysilicon layer, and the select transistor is formed by the second polysilicon layer, a first N-type doped region, and a second N-type doped region, wherein the first N-type doped region and the second N-type doped region are deposited in the P-well, wherein the P-well is deposited apart from the N-well, wherein the P-well and the N-well are deposited on a substrate, wherein the first non-volatile memory cell is deposited in the P-well and coupled to a first bit line, a first source line, a first word line, and a first control line, wherein the second non-volatile memory cell is deposited in the P-well and coupled to a second bit line, a second source line, the first word line, and the first control line, wherein the third non-volatile memory cell is deposited in the P-well and coupled to the first bit line, the first source line, a second word line, and a second control line, wherein the fourth non-volatile memory cell is deposited in the P-well and coupled to the second bit line, the second source line, the second word line, and the second control line.

19. The non-volatile memory array of claim 18, wherein when the first non-volatile memory cell is in a read mode, a first positive voltage is applied to the first word line, the first bit line, the first control line, and the N-well, while the P-well and the first source line are coupled to a ground.

20. The non-volatile memory array of claim 19, wherein when the first non-volatile memory cell is in a program mode, the N-well and the P-well are coupled to the ground, a second positive voltage is applied to the first word line, the first source line, and the first bit line, while a first negative voltage is applied to the first control line such that electrons are injected into the first floating gate from the first control line, wherein the second positive voltage and an absolute value of the first negative voltage are lower than a breakdown voltage and exceed the first positive voltage.

21. The non-volatile memory array of claim 20, wherein when the first non-volatile memory cell is in the program mode, the second bit line, the second source line, the second word line, and the second control line are coupled to the ground.

22. The non-volatile memory array of claim 20, wherein when the first non-volatile memory cell is in an erase mode, a third positive voltage is applied to the first control line and the N-well while the first word line, the first source line, the first bit line, and the P-well are coupled to the ground such that electrons are ejected from the first floating gate to the first control line, wherein the third positive voltage exceeds the breakdown voltage.

23. The non-volatile memory array of claim 22, wherein when the first non-volatile memory cell is in the erase mode, the second word line is coupled to the ground while a fourth positive voltage is applied to the second bit line, the second source line, and the second control line, the fourth positive voltage is less than the breakdown voltage and exceeds the first positive voltage, wherein a difference between the third positive voltage and the fourth positive voltage is less than the breakdown voltage.

24. The non-volatile memory array of claim 20, wherein when the first non-volatile memory cell is in an erase mode, a fourth positive voltage is applied to the first control line and the N-well while a second negative voltage is applied to the first word line, the first source line, the first bit line, and the P-well such that the electrons are ejected from the first floating gate to the first control line, wherein the fourth positive voltage and an absolute value of the second negative voltage are lower than the breakdown voltage and exceed the first positive voltage.

25. The non-volatile memory array of claim 24, wherein when the first non-volatile memory cell is in the erase mode, the second bit line, the second source line, the second word line, and the second control line are coupled to a ground.

26. The non-volatile memory array of claim 18, wherein the first source line and the second source line are coupled to a source node.

27. The non-volatile memory array of claim 26, wherein when the first non-volatile memory cell is in a read mode, a first positive voltage is applied to the first word line, the first bit line, the first control line, and the N-well, while the P-well and the source node are coupled to a ground.

28. The non-volatile memory array of claim 27, wherein when the first non-volatile memory cell is in a program mode, the N-well and the P-well are coupled to the ground, a second positive voltage is applied to the first bit line, and a first negative voltage is applied to the first control line such that electrons are injected into the first floating gate from the first control line, wherein the second positive voltage is less than a breakdown voltage and exceeds the first positive voltage.

29. The non-volatile memory array of claim 28, wherein when the first non-volatile memory cell is in the program mode, the first word line, the source node, the second bit line, the second word line, and the second control line are coupled to the ground.

30. The non-volatile memory array of claim 28, wherein when the first non-volatile memory cell is in an erase mode, a third positive voltage is applied to the first control line and the N-well, a fourth positive voltage is applied to the source node, while the first word line, the first bit line, and the P-well are coupled to a ground such that the electrons are ejected from the first floating gate to the first control line, wherein the third positive voltage exceeds the breakdown voltage, the fourth positive voltage is less than the breakdown voltage, and a difference between the third positive voltage and the fourth positive voltage is less than the breakdown voltage.

31. The non-volatile memory array of claim 30, wherein when the first non-volatile memory cell is in the erase mode, the second word line is coupled to the ground while a fourth positive voltage is applied to the second bit line, and the second control line.

32. The non-volatile memory array of claim 28, wherein when the first non-volatile memory cell is in an erase mode, a fourth positive voltage is applied to the first control line and the N-well while a second negative voltage is applied to the first word line, the first bit line, and the P-well such that the electrons are ejected from the first floating gate to the first control line, wherein the fourth positive voltage and an absolute value of the second negative voltage are lower than the breakdown voltage.

33. The non-volatile memory array of claim 32, wherein when the first non-volatile memory cell is in the erase mode, the second bit line, the source node, and the second control line are coupled to the ground while the second negative voltage is applied to the second word line.

34. The non-volatile memory array of claim 18, wherein the first polysilicon layer comprises a first part and a second part, wherein the floating-gate transistor is formed by the first part overlapped with the second N-type doped region and a third N-type doped region, wherein the third N-type doped region is deposited in the P-well, wherein the second part extends from the P-well to the N-well, wherein the second part comprises a first overlapped area that overlaps with the P-type doped region, wherein the first overlapped area has a first overlap width, and the P-type doped region has a first width, wherein each of the non-volatile memory cells further comprises:
an N-type doped region, formed in the N-well, wherein the second part further comprises a second overlapped area that overlaps with the N-type doped region, wherein the second overlapped area has a second overlap width and the N-type doped region has a second width, wherein the second overlap width is equal to the second width.

35. The non-volatile memory array of claim 34, wherein either one of the non-volatile memory cells in the non-volatile memory array is in an erase mode, all the non-volatile memory cells are erased simultaneously.

36. The non-volatile memory array of claim 34, wherein when the first non-volatile memory cell is in an erase mode, a third positive voltage is applied to the N-well, a fourth positive voltage is applied to the first control line, while the first word line, the first source line, the first bit line, and the P-well are coupled to a ground such that electrons are ejected from the floating gate to the N-well through the N-type doped region, wherein the third positive voltage exceeds a breakdown voltage, the fourth positive voltage is less than the breakdown voltage, and a difference between the third positive voltage and the fourth positive voltage is less than the breakdown voltage.

* * * * *